United States Patent [19]
Baurand et al.

[11] Patent Number: 5,834,934
[45] Date of Patent: Nov. 10, 1998

[54] INDUCTIVE CURRENT SENSOR WITH REDUCED INFLUENCE OF SPURIOUS GAPS AND ELECTRICAL APPARATUS INCLUDING IT

[75] Inventors: Gilles Baurand, Montesson la Borde; Gérald Gaschet, Puteaux; Dominique Leglaye, Rueil Malmaison, all of France

[73] Assignee: Schneider Electric SA, Boulogne Billancourt, France

[21] Appl. No.: 689,688

[22] Filed: Aug. 13, 1996

[30] Foreign Application Priority Data

Aug. 14, 1995 [FR] France .................................. 95 09869

[51] Int. Cl.$^6$ .................................................. G01R 33/00
[52] U.S. Cl. ........................................ 324/127; 324/117 R
[58] Field of Search ................................ 324/127, 117 R; 336/175, 130, 132, 233

[56] References Cited

U.S. PATENT DOCUMENTS

| | | | |
|---|---|---|---|
| 2,501,558 | 3/1950 | Williams | 367/135 |
| 3,386,032 | 5/1968 | Medlar | 324/127 |
| 4,286,213 | 8/1981 | Fowler | 324/127 |
| 5,495,169 | 2/1996 | Smith | 324/127 |
| 5,552,700 | 9/1996 | Tanabe et al. | 324/117 H |

FOREIGN PATENT DOCUMENTS

| | | |
|---|---|---|
| 0 082 082 | 6/1983 | European Pat. Off. . |
| 28 33 035 | 2/1980 | Germany . |

Primary Examiner—Josie Ballato
Assistant Examiner—Russell M. Kobert
Attorney, Agent, or Firm—Oblon, Spivak, McClelland, Maier & Neustadt, P.C.

[57] ABSTRACT

Inductive current sensor and electrical apparatus incorporating this sensor. The magnetic circuit of the sensor comprises a separable part carrying the detector element and is made of a material having a permeability lying between 5 and 100. The circuit reduces the influence of spurious gaps and external interference on the current sensor for the electrical apparatus.

8 Claims, 2 Drawing Sheets

INDUCTIVE CURRENT SENSOR WITH REDUCED INFLUENCE OF SPURIOUS GAPS AND ELECTRICAL APPARATUS INCLUDING IT

This invention relates to an inductive current sensor an electrical apparatus comprising a magnetic circuit of which one part acts as a support for a magnetic field detector element such as a detector coil and a conductor surrounded by the magnetic circuit and traversed by the current to be detected. It also relates to the electrical apparatus provided with such a sensor or sensors.

Current sensors of the type mentioned above are well known and are used in electrical power apparatuses such as circuit-breakers, overcurrent relays or speed controllers for the purpose of detecting excess currents so that the supply of the charge connected to the appliance can be cut off.

When the apparatus is assembled, it is helpful if the current conductor can be inserted easily in the sensor. However, in most cases current sensors comprise a closed magnetic circuit in which the conductor must be placed, thereby making assembly impractical. Moreover, the protective apparatus may require different sensors depending on the connectable charges, and it is desirable, either during the manufacture of the appliance or during its installation, that it should be adapted or customized depending on its application.

When a current sensor of the type described is constituted by a current transformer, the material of the magnetic circuit presents a strong permeability, typically greater than 5000. In this case a current transformer is sensitive to interference, and when it is desired to make a magnetic circuit with a separable part, the spurious gap formed at the connection of the separable part to the fixed part has a bad influence on measuring.

When the current sensor is formed by a Rogowski core, permeability is on the order of 1 and the need for a large number of turns for secondary winding means is such that it is not easy to arrange them on a separable part. In addition, coil winding must be carried out continuously on the core in order to ensure immunity to electromagnetic interference.

The invention aims to reduce the influence of spurious gaps and external interference on a current sensor for an electrical apparatus. It also aims to facilitate the assembly of the current sensor in the electrical appliance and the adaptation of said appliance to different charge characteristics.

According to the invention, the magnetic circuit comprises an open magnetic part and a magnetic part separate from the open magnetic part and which carries the detector element, at least one of the two parts of the magnetic circuit being in a material of weak permeability. Said permeability may be between 5 and 100, preferably between 8 and 30. As a result, the gap of the magnetic circuit can be considered as spread along the circuit and the sensor shows little sensitivity to any spurious gap which might be observed at the interface between the separate part and the open part of the magnetic circuit.

The electrical apparatus according to the invention is provided with at least one such current sensor whose open magnetic part is arranged permanently in the casing of the apparatus and whose closing separate magnetic part is fixed either to a printed circuit board comprising a circuit for processing the electrical signal delivered by the detector element, said processing circuit generating a trip signal when an overcurrent is detected, or to a part or cover detachable from the casing, said part or cover carrying, preferably on the separate magnetic part side, such a printed circuit board.

It should be understood that the permanent open magnetic part can advantageously belong to a lower general purpose part of the apparatus, while the separate closing magnetic part can belong to an electronic processing part specifically designed depending on a rating, particularly a current rating, of the apparatus. In other words, one may assemble to an unchanged bottom part of the electrical apparatus different electronic processing units each adapted to a different electric size. The assembly operation can be executed either by the manufacturer or by the user.

The following description of an embodiment read with reference to the accompanying drawings, will provide an explanation of the features and advantages of the invention.

Figure 1:
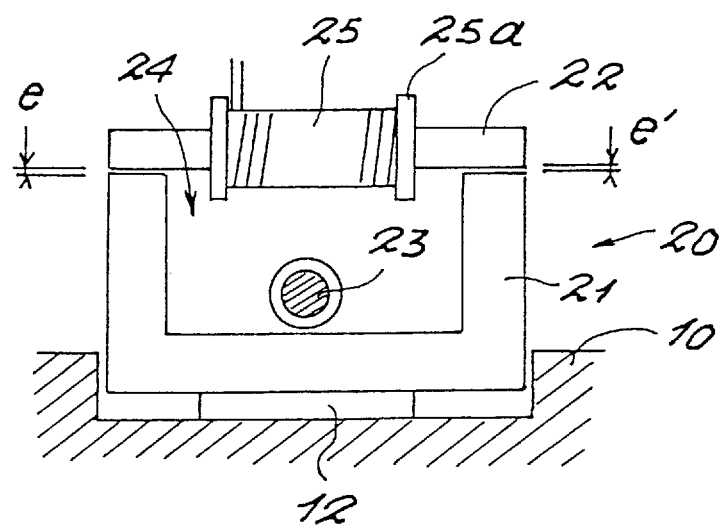
FIG. 1 is a schematic illustration of an inductive current sensor in accordance with the invention.

The current sensor 20 is housed in an insulating casing 10 of a low-voltage electrical apparatus, this casing showing a front face 11 which is accessible to an operator from the outside.

The sensor 20 comprises an open fixed magnetic circuit 21, for example U- or L-shaped, fixed by any appropriate means in the casing 10 of the apparatus, and a separate magnetic circuit 22 formed, for example, by a pallet added so as to bridge the fixed circuit in order to establish a magnetic path without nominal gap for the magnetic flux. When the circuit 21 is L-shaped, an identical L-shaped part may be used for the circuit 22. A power conductor 23 belonging to a low-frequency current path, for example 50 or 60 Hz, of the apparatus is inserted in the aperture 24 of the fixed magnetic circuit 21 into said apparatus and remains fixed in a well-determined position by retaining means. A coil 25 wound around a coil frame 25a associated with the separate magnetic circuit 22 is mounted on a printed circuit board 26, itself fixed to a detachable cover or housing 27 in insulating material and accessible from the outside of the casing, on the front wall 11 side of said casing; the cover 27 can form a part of the front face of the casing (see FIG. 2). The magnetic circuit 22 is fixed to the board 26 by legs 28. The circuits 21, 22 have a weak magnetic permeability, preferably between 8 and 30, and for this purpose are made of carbonyl iron-based material or another analogous material of weak permeability. A resilient element 12 may be placed between the open magnetic circuit 21 and the casing, in combination with a non-represented stop for this circuit 21 so as to help reduce the spurious gap e or e'.

Depending on the case, both circuits 21, 22 are in material of weak permeability or only one of said circuits 21, 22 are in such material. It will be observed that the current measurement is not sensitive to the presence of slight spurious gaps e and e'.

The electrical appliance considered may be a circuit-breaker, a contactor, a protective relay or a speed controller, and may present several sensors, the printed circuit board 26 holding the processing circuit 30 of the signals supplied by the various sensors so as to generate a trip signal. The detachable cover 27 may be a simple plastron (FIG. 2) or may be arranged as a housing supporting other members.

Figure 2:
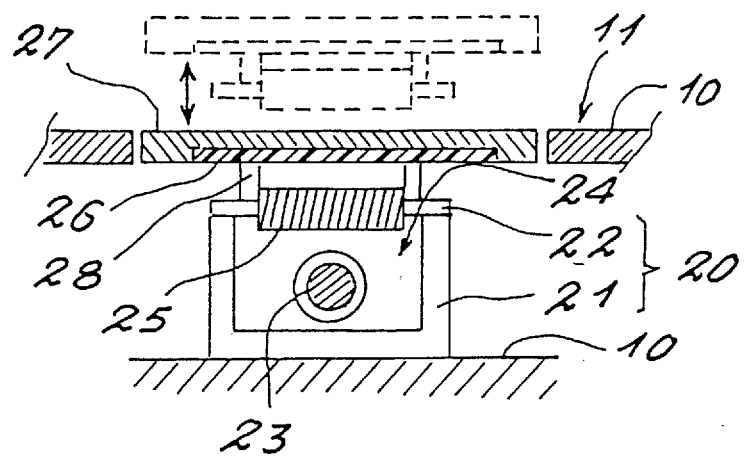
FIG. 2 is a sectional view of a sensor assembled in an appliance according to the invention.

In FIG. 2, the separate part 22 of the magnetic circuit and its detachable carrier cover 27 in the extracted position are represented by dashed lines; it may be understood that this arrangement facilitates both the installation of the conductor 23 and the changing of the detector element 25. The same cover may of course hold two or three detachable magnetic circuits 22 of corresponding sensors associated with respective phases. A single detachable rail 22 can be provided for a plurality of phases, said rail bearing the respective coils 25. The detector element illustrated in the form of a coil 25 may be constituted by a Hall effect detector or another analogous element detecting the magnetic field generated by the passage of the current in the conductor 23.

Figure 3:
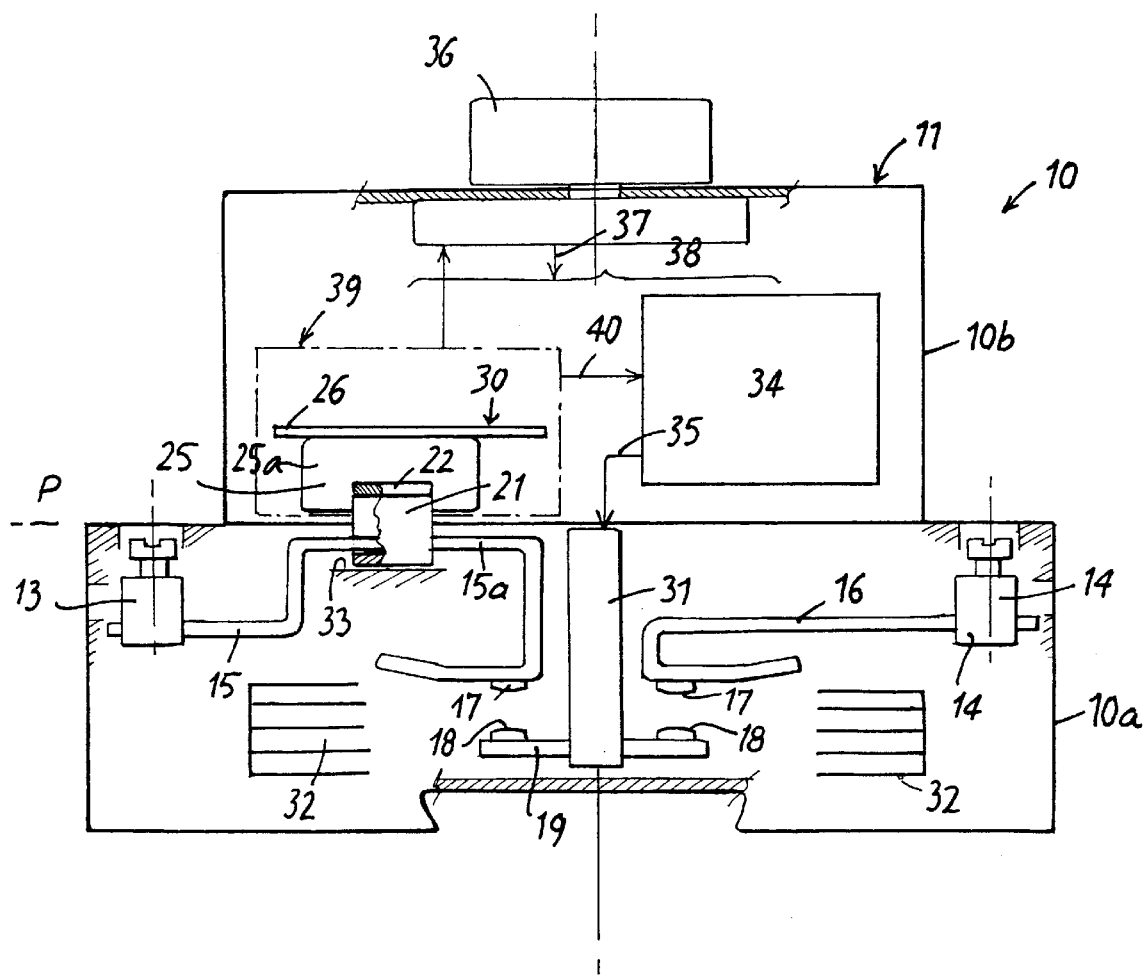
FIG. 3 shows a schematic view of a contactor-circuit-breaker apparatus.

FIG. 3 shows a polyphase contactor circuit breaker apparatus the casing 10 of which comprises a base body 10*a* and a front part 10*b* assembled to the base body, the front part can itself comprise a functional unit or a plurality of functional units.

The base body 10*a* has for each phase two power terminals 13, 14 to which are associated respective conductive parts 15, 16 bearing fixed contacts 17 facing moving contacts 18 located on a contact bridge 19. The contact bridges 19 are borne by a moving support 31. Close to the contacts are situated arc extinction chambers provided with arc extinguishing plates 32.

The conductive part 15 is elevated in a region 15*a* close to the assembly plane P of the casing parts 10*a*, 10*b* so as to pass through a fixed U-shaped part 21 of the magnetic circuit; this part 21 lies on surfaces 33 of the base body 10*a* and projects slightly beyond plane P towards the front part 10*b* of the casing.

The front part 10*b* of the apparatus casing has an electromagnet 34 which can actuate directly, as shown by arrow 35, the contact support 31. On the front side of the part 10*b* is provided a manual control button 36 which cooperates, as shown by arrow 37, with the control unit formed by electromagnet 34 and an electronic processing block 39. The block 39 comprises the closing parts 22 of the magnetic circuits, the detecting coils 25 and the board 26 bearing the overcurrent processing circuit 30. The circuit 30 is electrically connected to the electromagnet coil 34, as shown by arrow 40.

The base body 10*a* of the apparatus remains the same for a plurality of apparatus types or sizes and it should be understood that differentiation between apparatuses is provided by the front part 10*b* of the casing, due to the interchangeable magnetic circuit closure parts 22, their secondary coils 25 and the specific processing circuits 30.

What is claimed is:

1. Inductive current sensor for electrical apparatus comprising:

a magnetic circuit of which one part acts as a support to a detector element, a power conductor encircled by the magnetic circuit and traversed by the current to be detected, the magnetic circuit comprising an open magnetic part and a closing magnetic part separate from the open magnetic part and carrying the detector element, wherein at least one of said open of the magnetic part and said closing magnetic part comprises material having a magnetic permeability of between 5 and 100.

2. Sensor according to claim 1, wherein the permeability of the material of the magnetic circuit lies between 8 and 30.

3. Sensor according to claim 2, characterized in that the material of the magnetic circuit is carbonyl iron based.

4. Electrical apparatus provided with at least one inductive current sensor comprising:

a magnetic circuit of which one part acts as a support to a detector element, a conductor encircled by the magnetic circuit and traversed by the current to be detected, the magnetic circuit comprising an open magnetic part and a closing magnetic part separate from the open magnetic part and carrying the detector element, wherein at least one of said open magnetic part and said closing magnetic part comprises material having a magnetic permeability of between 5 and 100, the open magnetic part is arranged permanently in a casing of the apparatus and the closing magnetic part is fixed to an interchangeable electronic processing unit.

5. Apparatus according to claim 4, characterized in that the interchangeable processing unit carries, on the closing magnetic part side, a printed circuit board comprising a processing circuit of the electrical signal delivered by the detector element.

6. Apparatus according to claim 4, characterized in that the open magnetic part of the sensor magnetic circuit is associated to a power conductor located in a base body of the apparatus, said base body comprising fixed contacts and moving contacts associated to the conductor and arc extinguishing chambers close to the contacts, whereas the closing part of the sensor magnetic circuit is housed with the interchangeable processing unit in a casing front part fastened to the body part.

7. Apparatus according to claim 6, characterized in that the open magnetic part is located on an elevated region of a conductive part housed in the base body close to an assembly plane of the casing parts.

8. Apparatus according to claim 4, wherein the magnetic permeability of the material of the magnetic circuit is between 8 and 30.

* * * * *